United States Patent [19]

Fang

[11] Patent Number: 5,670,898
[45] Date of Patent: Sep. 23, 1997

[54] LOW-POWER, COMPACT DIGITAL LOGIC TOPOLOGY THAT FACILITATES LARGE FAN-IN AND HIGH-SPEED CIRCUIT PERFORMANCE

[75] Inventor: Emerson Fang, Daly City, Calif.

[73] Assignee: Silicon Graphics, Inc., Mountain View, Calif.

[21] Appl. No.: 561,914

[22] Filed: Nov. 22, 1995

[51] Int. Cl.$^6$ .................................................. H03K 19/017
[52] U.S. Cl. ............................ 326/93; 326/21; 326/121
[58] Field of Search ................................. 326/21, 33, 93, 326/98, 121

[56] References Cited

U.S. PATENT DOCUMENTS

| | | |
|---|---|---|
| 4,291,247 | 9/1981 | Cooper, Jr. et al. ............. 326/98 X |
| 4,569,032 | 2/1986 | Lee ...................................... 326/98 X |
| 4,700,086 | 10/1987 | Ling et al. ........................ 326/98 X |
| 4,780,626 | 10/1988 | Guerin et al. ........................ 326/98 |
| 4,797,580 | 1/1989 | Sunter .................................. 326/98 |
| 4,899,066 | 2/1990 | Aikawa et al. ...................... 326/98 |
| 5,343,096 | 8/1994 | Heikes et al. .................... 326/21 X |
| 5,450,027 | 9/1995 | Gabara ........................... 326/121 X |
| 5,467,026 | 11/1995 | Arnold ............................ 326/33 X |

OTHER PUBLICATIONS

Dobberpuhl, Daniel W. et al., "A 200–MHz 64–b Dual–Issue CMOS Microprocessor", *IEEE Journal of Solid–State Circuits*, vol. 27, No. 11, pp. 1555–1564, Nov. 1992.

Yuan, Jiren and Christer Svensson, "High–Speed CMOS Circuit Technique", *IEEE Journal of Solid–State Circuits*, vol. 24, No. 1, pp. 62–70, Feb. 1989.

*Primary Examiner*—David R. Hudspeth
*Attorney, Agent, or Firm*—Sterne, Kessler, Goldstein & Fox P.L.L.C.

[57] ABSTRACT

A circuit topology for implementing combinational logic functions with large fan-in, high speed, and low power consumption using a combination of dynamic and static gates. The circuit topology includes a dynamic gate and a Pseudo-NMOS gate coupled to the dynamic gate.

4 Claims, 11 Drawing Sheets

LOW-POWER, COMPACT DIGITAL LOGIC TOPOLOGY THAT FACILITATES LARGE FAN-IN AND HIGH-SPEED CIRCUIT PERFORMANCE

BACKGROUND OF THE INVENTION

1. Field of the Invention

The present invention generally relates to digital logic circuitry, and more specifically to a low-power, compact digital logic topology that facilitates large fan-in and high-speed circuit performance.

2. Related Art

Figure 1:
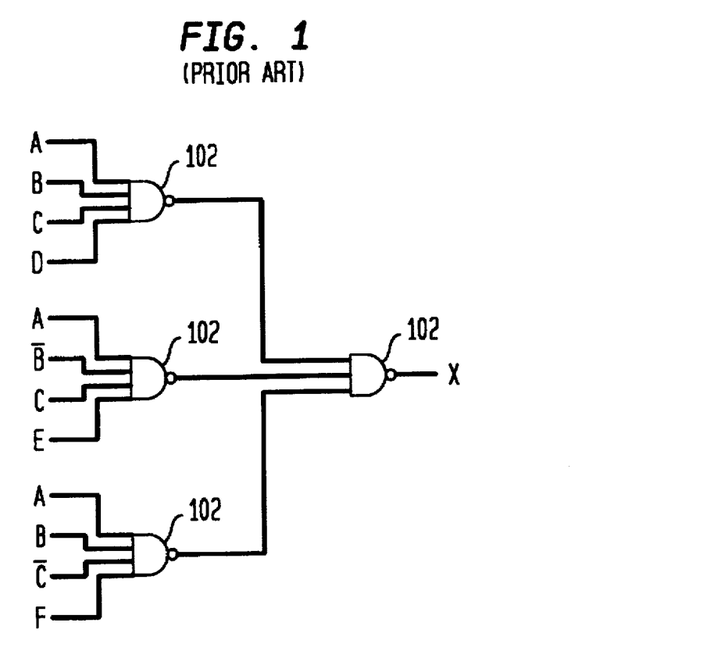
FIG. 1 is a schematic diagram of a NAND gate realization of the logic expression in equation (1).

Any combinational logic equation may be written as an expression of the sum of the product of multiple independent binary variables. One example of such a logic expression is:

$$X = ABCD + \bar{A}BCE + AB\bar{C}F \tag{1}$$

where ABCD, $\bar{A}BCE$ and $AB\bar{C}F$ are product terms. A, B, C, D, E, and F are inputs to the logic function and X is the desired output of the logic function. FIG. 1 illustrates the logic function in Equation (1) implemented with NAND gates 102. However, by application of the DeMorgan's Law, X can also be expressed as a product of sums with appropriate inversions added. Hence, the logic function in Equation (1) then becomes:

$$\bar{X} = (\bar{A}+\bar{B}+\bar{C}+\bar{D})(A+\bar{B}+\bar{C}+\bar{E})(\bar{A}+\bar{B}+C+\bar{F}) \tag{2}$$

Figure 2:
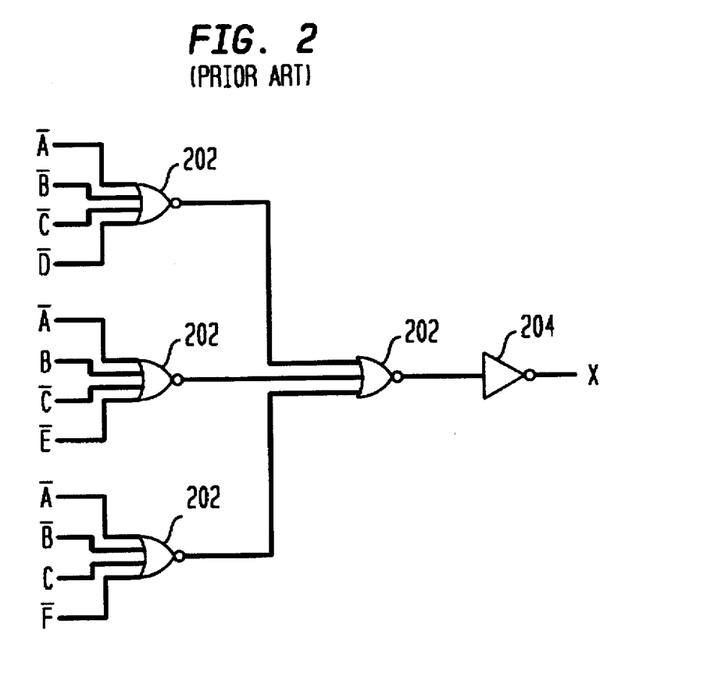
FIG. 2 is a schematic diagram of a NOR gate realization of the logic expression in equation (2).

The product terms have now been converted to sum terms. FIG. 2 illustrates the logic function in Equation (2) implemented using NOR gates 202 and an inverter 204. Thus, if either NAND or NOR gates 102, 202 with arbitrarily large inputs can be fabricated, any combinational logic function can be implemented with just two gate levels. Furthermore, if gate delays are independent of the number of gate inputs, and the NAND or NOR gates 102, 202 have gate delays of one unit, then any combinational logic function can be implemented with a signal path delay of only two units. To obtain fast circuitry, logic designers seek topologies that have signal path delays that approximate this ideal case.

Gates, such as NAND and NOR gates 102, 202, are fabricated with active devices, such as field effect transistors (FETs). The active devices can be configured as switches or active loads.

Figure 3:
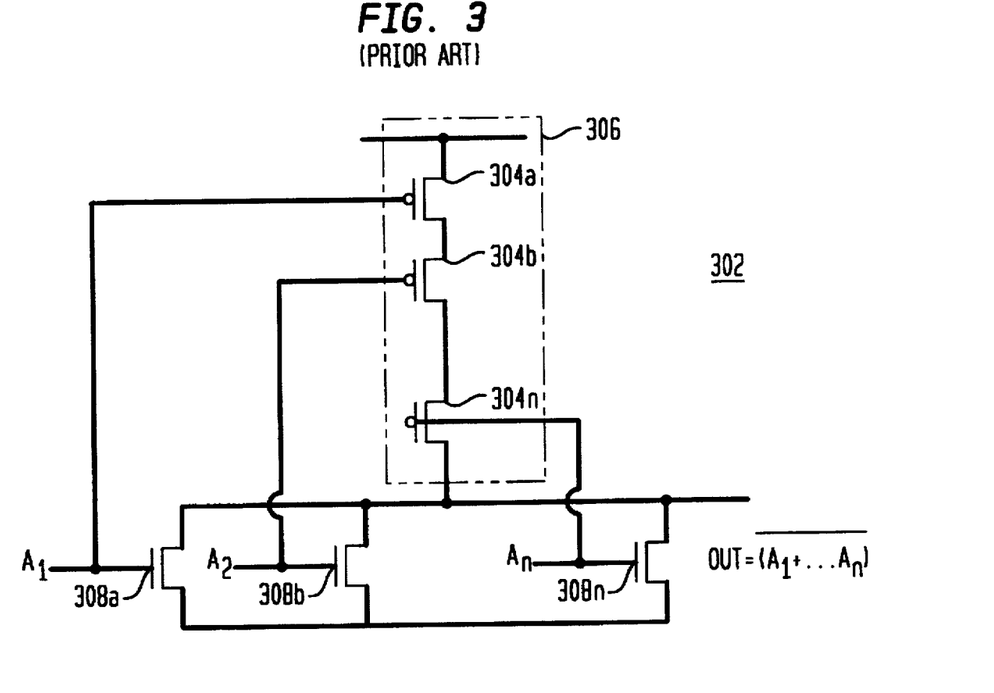
FIG. 3 is a schematic diagram of a n-input CMOS NOR gate.

The ideal case is difficult to attain using conventional CMOS circuitry when there is large fan-in. FIG. 3 illustrates a circuit implementation of a CMOS NOR gate 302. The CMOS NOR gate 302 requires one PMOS FET 304 to be serially connected in the active load section 306 of the CMOS NOR gate 302 for each NMOS FET, or switch, 308a–n used. In static CMOS logic, the active load section 306 is known as a complementary PMOS section. As a result, the speed and output level of the CMOS NOR gate 302 are reduced for large fan-in gates due to the increased gate output resistance created by the serially connected PMOS devices 304a–n.

In place of CMOS circuitry, a traditional Pseudo-NMOS NOR gate can be used to attain high speed and output level for gates with a large fan-in. However, a traditional Pseudo-NMOS NOR gate has higher power consumption than a CMOS NOR gate 302. The traditional Pseudo-NMOS NOR gate also has unbalanced output rise and fall times, and a significant output low voltage. Increased output low voltage can degrade the circuit's noise margin. The imbalance between rise and fall time results from poor matching quality between the active load section 306 (PMOS) and the switches 308–n (NMOS). Output low voltage can be diminished in Pseudo-NMOS gates by cascading multiple Pseudo-NMOS gates.

Figure 4:
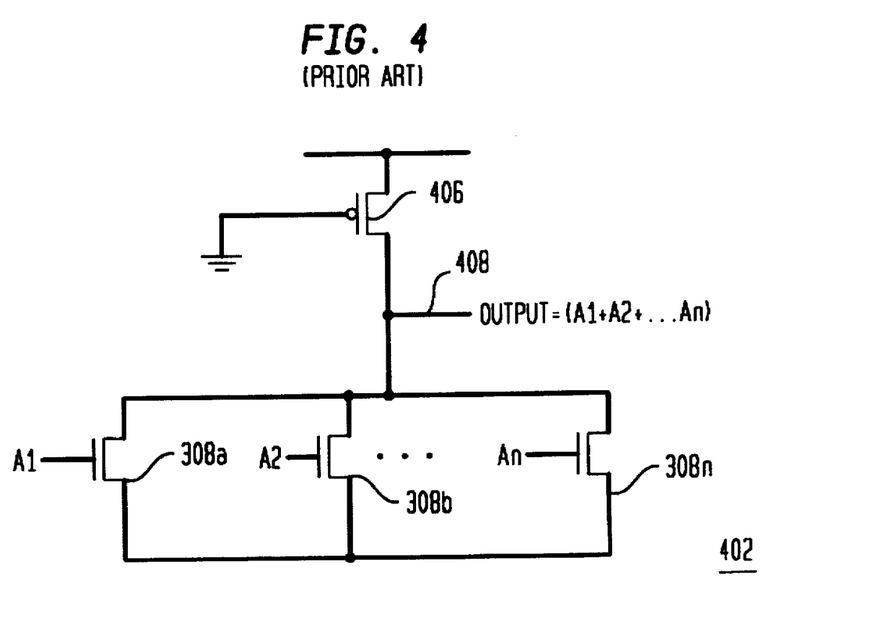
FIG. 4 is a schematic diagram of a n-input traditional Pseudo-NMOS NOR gate.

FIG. 4 illustrates the circuit implementation for a conventional Pseudo-NMOS NOR gate 402 with an output 408. The conventional Pseudo-NMOS NOR gate 402 is comprised of NMOS FETs 308a–n, that act as switches, and a PMOS FET 406, that acts as an active load.

Large fan-in digital logic circuitry is often required as a sub-component in large digital circuits, such as microprocessors. It is therefore desirable to implement a large fan-in digital circuit that is fast, so as not to delay the overall processing time of the microprocessor, and which consumes little power.

SUMMARY OF THE INVENTION

In accordance with the present invention, there is provided a digital logic topology facilitating large fan-in, high-speed and low-power consumption. The topology utilizes a Domino logic structure that is composed of dynamic, or clocked, gates coupled with static gates. In the present invention, the dynamic gate is preferably a dynamically precharged gate (DPG). The static gate is a Pseudo-NMOS gate, and preferably an improved Pseudo-NMOS gate designed to minimize power consumption, have equivalent output rise and fall times, and have reduced output offset voltage.

The coupling of DPG and improved Pseudo-NMOS gates facilitates a high-speed, low-power implementation of combinational logic functions having many inputs and sum terms. The DPGs are dynamic and consume no static power. The Pseudo-NMOS gates, improved or traditional, consume significantly more power than DPGs or CMOS gates. However, the Pseudo-NMOS gates are typically used in the second stage of the NOR-NOR structure. The number of DPGs typically is five to ten times the number of Pseudo-NMOS gates. Therefore because the power consumed by the Pseudo-NMOS gates is averaged over the large fan-in logic circuit, the power consumption of a DPG-Pseudo-NMOS gate with large fan-in is significantly less than a large fan-in circuit using purely Pseudo-NMOS gates. As a result, complex combinational logic functions having many inputs, but relatively few sum terms, can be implemented with a DPG-Pseudo-NMOS structure having low power consumption.

Improved Pseudo-NMOS gates can be implemented to reduce the power consumption. The improved gates utilize clock and other signals to minimize power consumption of the gate when the clock or gate output are low. The improved Pseudo-NMOS gates can also be used to implement new latch gates having logic functionality.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Overview and Discussion of the Invention

Figure 5:
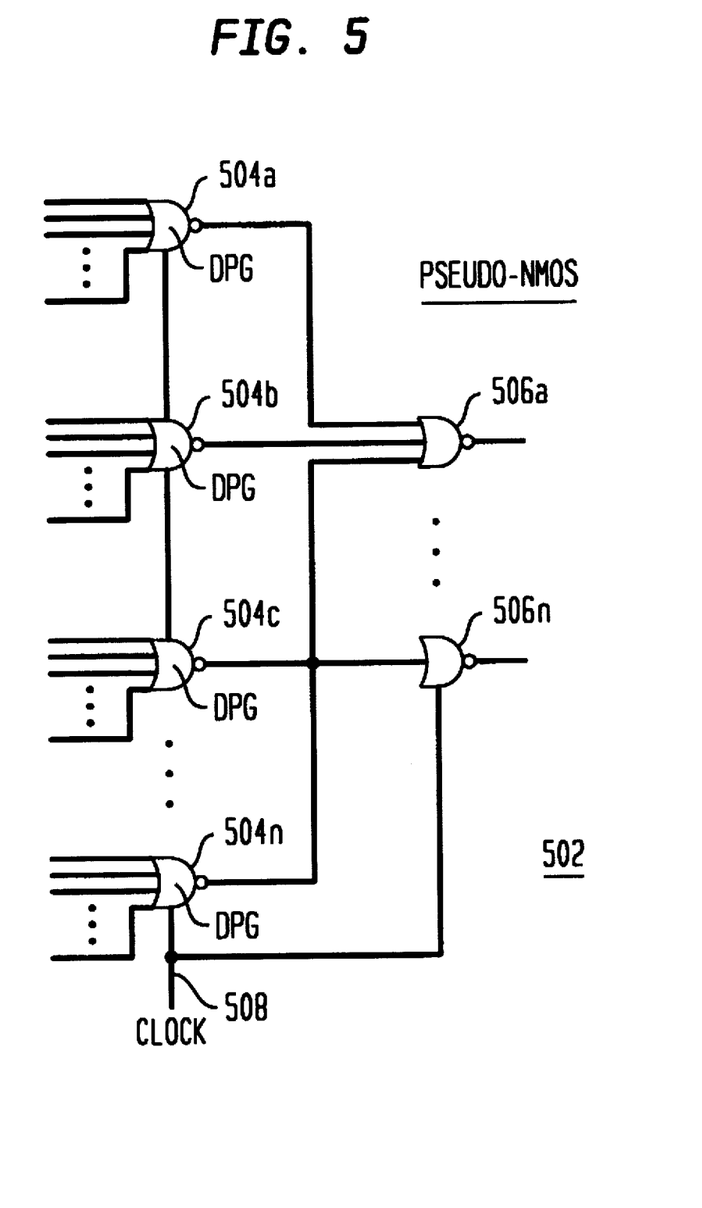
FIG. 5 is a schematic diagram of Domino Logic implemented with DPG and Pseudo-NMOS gates.

The present invention is directed toward facilitating fast and low power logic implementing a combinational logic function having many inputs. This goal is achieved with Domino logic incorporating DPG gates cascaded with improved Pseudo-NMOS gates. Improved Pseudo-NMOS gates are preferable because they have less power consumption, equivalent output rise and fall times, reduced output low voltage. However, conventional Pseudo-NMOS gates can alternatively be used in this topology. FIG. 5 illustrates one embodiment of Domino logic 502 with DPG NOR gates 504a-n coupled with improved Pseudo-NMOS NOR gates 506a-n. A clock signal 508 is applied to the Domino logic for reasons described below.

Figure 14:
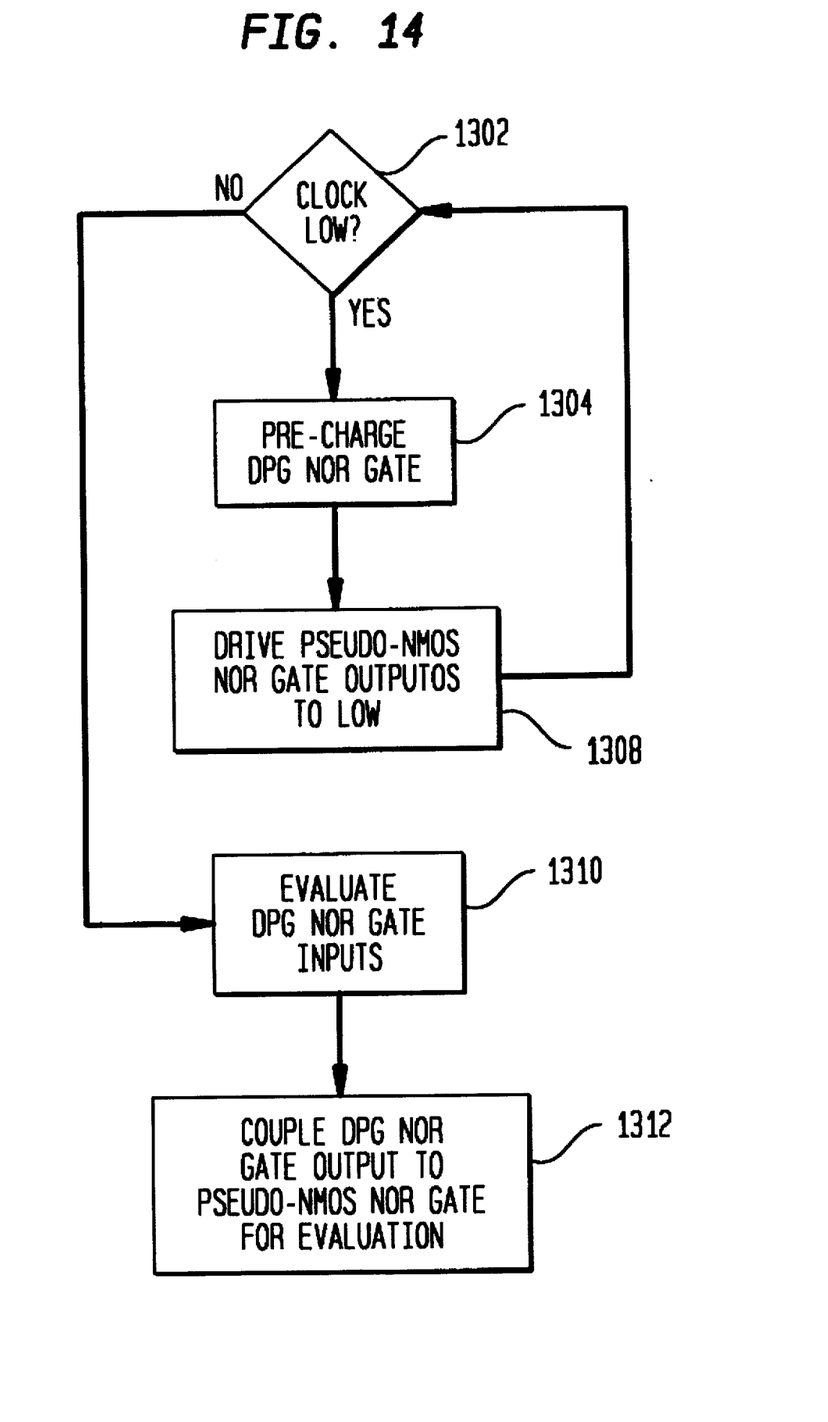
FIG. 14 is a flowchart of DPG NOR-Pseudo-NMOS NOR gate operation.

FIG. 14 illustrates one method of operation of Domino logic comprised of DPG NOR gates 504a-n and improved Pseudo-NMOS NOR gates 506a-n. However, this method of operation may be applicable to Domino logic comprising DPG and Pseudo-NMOS gates with other logic functions. If the clock signal 508 is low (step 1302), capacitances in the switches of the DPG NOR gates 504a-n are precharged high (step 1304). Thus the output of the DPG NOR gates 504a-n are precharged high, and the inputs to the improved Pseudo-NMOS NOR gates 506a-n are also high. The outputs of the Pseudo-NMOS NOR gates 506a-n will be forced low regardless of the state of the clock signal 508 when all of the inputs of the Pseudo-NMOS NOR gates 506a-n are high. Since the clock signal 508 applied to the DPGs is low in the precharged state, the improved Pseudo-NMOS NOR gates 506a-n will not consume any static power during precharge state either. This property of the invention is important because typical power management controllers used with Domino logic employ the clock signal 508 to activate or deactive specific logic circuits. By holding the clock signal 508 low, the power management controller deactivates a logic circuit so that it consumes no power. When the clock signal 508 is low, the outputs of the improved Pseudo-NMOS NOR gates 506a-n are driven low (step 1308). Then the clock is again evaluated (step 1302).

When the clock signal 508 is found to be high (step 1302), the inputs of the DPG NOR gates 504a-n are evaluated (step 1310). Finally, the output of the DPG NOR gates 504a-n are coupled to the input of the improved Pseudo-NMOS NOR gates 506a-n for evaluation (step 1312).

Improved Pseudo-NMOS NOR gates 506a-n may be implemented in different embodiments. Three such embodiments are disclosed in the present application. The benefits of all three embodiments of the improved Pseudo-NMOS NOR gate are (1) to reduce circuit power consumption and (2) to cause the rise and fall times of the gate output to be equivalent. Similar embodiments of Pseudo-NMOS gates having different logic functions with the same two benefits can be also implemented, and will be apparent to persons skilled in the art based on the discussion contained herein.

Figure 6:
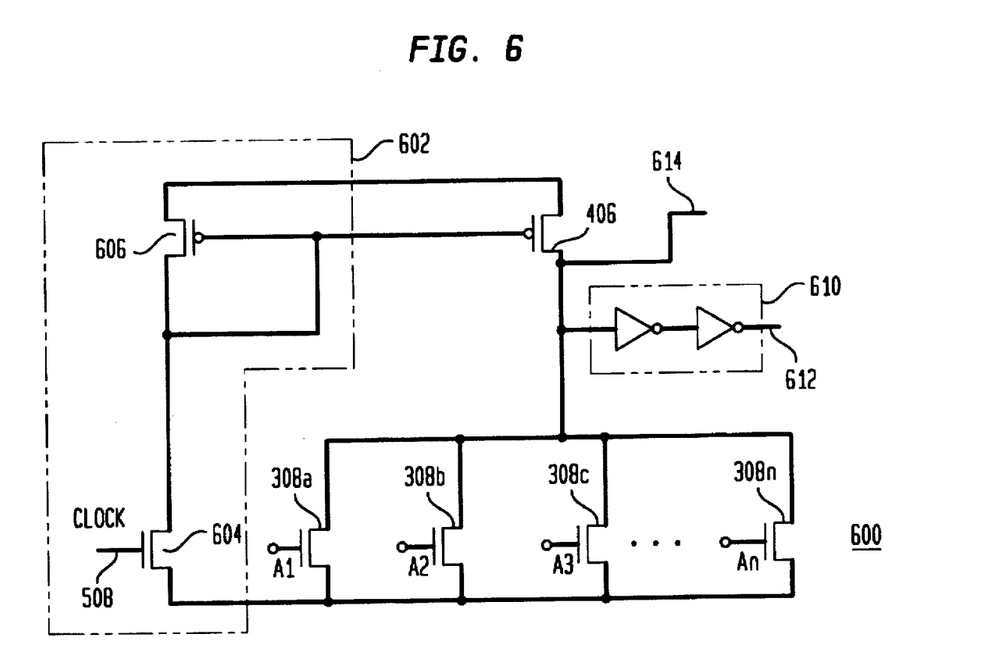
FIG. 6 is a schematic diagram of a first embodiment of an improved Pseudo-NMOS NOR gate.

FIG. 6 illustrates the first embodiment of the improved Pseudo-NMOS NOR gate (IPPNG1) 600. The IPNNG1 600 includes a conventional Pseudo-NMOS NOR gate 402 with the addition of a first power control circuit 602. The two benefits in the IPNNG1 600 are achieved with the first power control circuit 602, having NMOS FET 604, that acts as a switch, and a PMOS FET 606, that acts as an active load. First, rise and fall times of the output 614 of IPNNG1 600 are made equivalent by selecting appropriate FET dimensions. PMOS FETs 406, 606 form a current mirror and have channel widths that reliably permit the flow of current generated by the NMOS FET 604. The channel width of the NMOS FET 604 is chosen to replicate one-half of the current in one of the switches 308a-n when a switch is mined fully on. This replicated current is mirrored by the PMOS FETs 606, 406, forming the current mirror. So when all of the switches 308a-n are off, the currents in the PMOS FETs 606, 406 pull the output 614 high. However when one of the switches 308a-n is turned on, the current flowing through the switch is increased and pulls the output 614 low. The net pull down current is equivalent to the pull up current. Therefore, the rise and fall times of signals at the output 614 of the IPNNG1 600 are balanced.

Second, the power consumption of the IPNNG1 600 is reduced by turning the IPNNG1 600 off when the clock signal 508 is low and the IPNNG1 600 is not used. This clock signal 508 generally is the system clock signal used to activate dynamic circuitry, such as the DPG NOR gates 504a-n. However, the clock signal 508 applied to the improved Pseudo-NMOS NOR gates 506a-n could be another power control signal. The current flowing through the first power control circuit 602 is largely controlled by the clock signal 508 applied to the gate of the switch 604 in the first power control circuit 602. When the clock signal 508 is high, the switch 604 in the first power control circuit 602 is biased on so that current is drawn through the first power control circuit 602. The resulting gate-drain bias of both PMOS FETs 406, 606 is equal so that the IPNNG1 600 can evaluate its inputs At, A₁, A₂ . . . Aₙ. However, when the clock signal 508 is low, the first power control circuit 602, and thus the improved Pseudo-NMOS NOR gate 600, are biased off with no current flow. Hence, the IPNNG1 600 consumes power only when the clock signal 508 is high and the Domino logic 502, and the IPNNG1 600, are evaluating input information.

In addition, a Pseudo-NMOS gate may require one or two inverters 610 coupled to its output 614 as illustrated in FIG.

6. A single inverter may be required when the Pseudo-NMOS gate is coupled to CMOS logic to diminish the output low voltage and restore the output voltage peak amplitudes to the positive and negative supply voltages. A second inverter must be coupled to the first inverter, as illustrated in FIG. 6, if the Pseudo-NMOS gate is coupled to a DPG and the output low voltage needs to be diminished. The second inverter is required so that no inversion occurs between the Pseudo-NMOS gate and DPG in the Domino logic. The resulting cascaded inverter 610 has an output 612. It may be desirable to use one or two inverters 610, as discussed above, with all forms of Pseudo-NMOS gates which may implement different logic functions.

Figure 7:
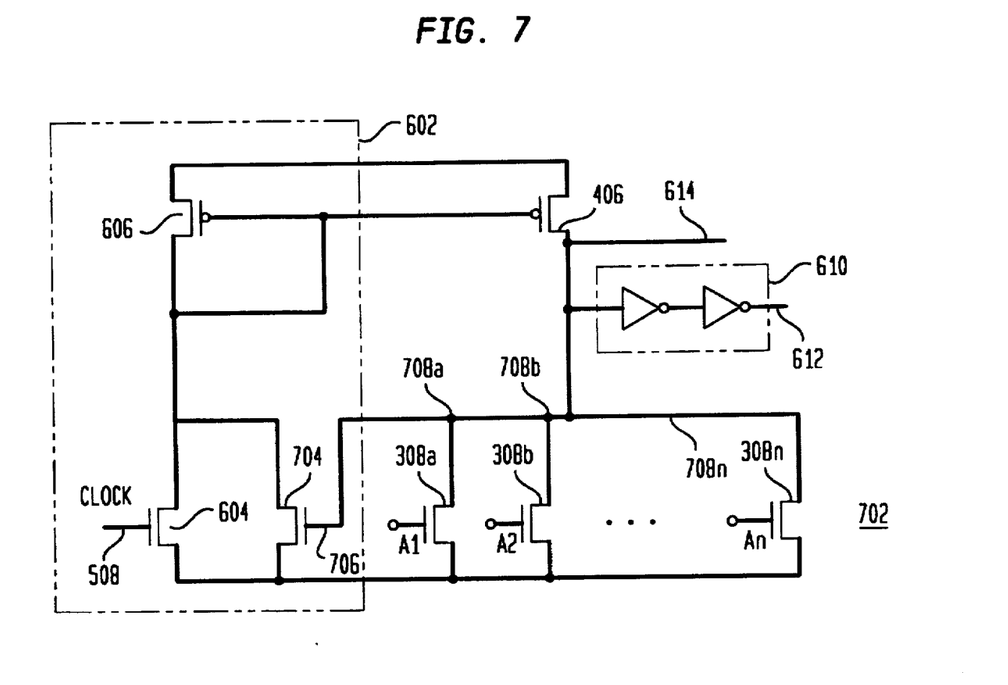
FIG. 7 is a schematic diagram of a second embodiment of an improved Pseudo-NMOS NOR gate.

A second embodiment of the improved Pseudo-NMOS NOR gate (IPNNG2) additionally eliminates floating voltage at the output 614 when the clock signal 508 is low. The IPNNG2 702 is illustrated in FIG. 7. The IPNNG2 702 includes a second NMOS FET 704 that is coupled in parallel across the switch 604 in the first power control circuit 602. The gate terminal 706 of the second NMOS FET 704 in the first power control circuit 602 is connected to the drain terminals 708a–n of the other switches 308a–n. As a result, when output 614 is high, the second NMOS FET 704 in the first power control circuit 602 is biased on. Then, when the clock signal 508 turns low, a small current is drawn through IPNNG2 702, latching the output 614 high. Without the second NMOS FET 704, the voltage at the output 614 would float if all the inputs $A_1$–$A_n$ of switches 308a–n are low. Furthermore, when DPGs are coupled to the improved Pseudo-NMOS NOR gates 506a–n, the output 614 can not float because when the clock is low, the outputs, which are inputs of the improved Pseudo-NMOS NOR gates 506a–n, are precharged to high.

Figure 8:
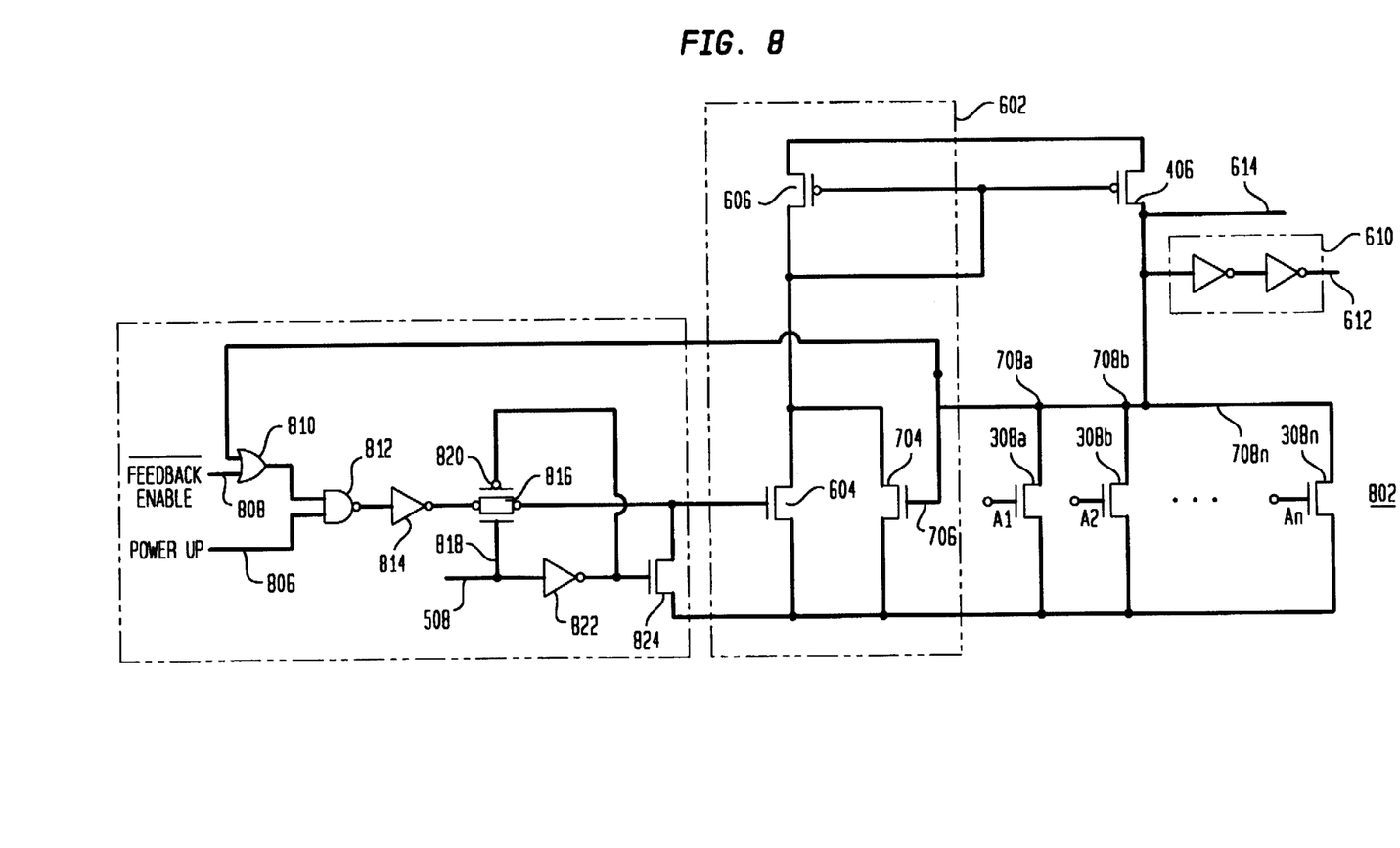
FIG. 8 is a schematic diagram of a third embodiment of an improved Pseudo-NMOS NOR gate.

The third embodiment of the improved Pseudo-NMOS NOR gate (IPNNG3) has further reduced power dissipation. The power dissipation of the IPNNG3 is further diminished by the implementation of additional power control circuitry coupled to the first power control circuit 602. The IPNNG3 802 is illustrated in FIG. 8. The additional, or second, power control circuitry 804 analyzes three inputs: the clock 508; power-up 806; and feedback enable 808 signals in order to further reduce power consumption. The power-up signal 806 is similar to the clock signal 508, but is delayed in time from the clock signal 508 so that the power up signal 806 transitions to its on-state about when the slowest input signal appears at the Domino logic 502. Typically, some margin should be added to the power-up signal 806, as the time of arrival of the slowest input signal of the Domino logic 502 cannot be exactly known. Thus, the IPNNG3 802 is powered from just before the last input signal arrives at the Domino logic 502 until the clock signal 508 transitions to its low state. Hence, the power consumption of the gate 802 is further diminished.

The power consumption of the gate 802 is also reduced by using the feedback enable signal 808 with the second power control circuit 804. The feedback enable signal is activated sometime after the IPNNG3 802 has evaluated its inputs $A_1$–$A_n$. When activated, the feedback enable signal 808 allows the switch 604 in the first power control circuit 602 to be mined off when the output 614 is low and IPNNG3 802 does not require power.

The second power control circuitry 804 is comprised of multiple gates and discrete devices. The outputs from the drain terminals 708a–n of the switch FETs 308a–n and the feedback enable signal 808 are applied to an OR gate 810. The output of the OR gate 810 is coupled to a NAND gate 812 which has another input from the power up signal 806.

The output of the NAND gate 812 is coupled through an inverter 814, and then through a pass gate 816, formed by parallel connected NMOS 818 and PMOS 820 FETs. The output of the pass gate 816 is coupled to the first power control circuit 602. The clock is applied to the gate of the NMOS FET 818 of the pass gate 816 and is then coupled to an inverter 820. The output of the inverter 820 is connected to the gate of the PMOS FET 820 of the pass gate 816, and also is connected to the gate of an NMOS FET, or a switch, 824. The switch 824 is shunted across an input to the first power control circuit 602.

Figure 9:
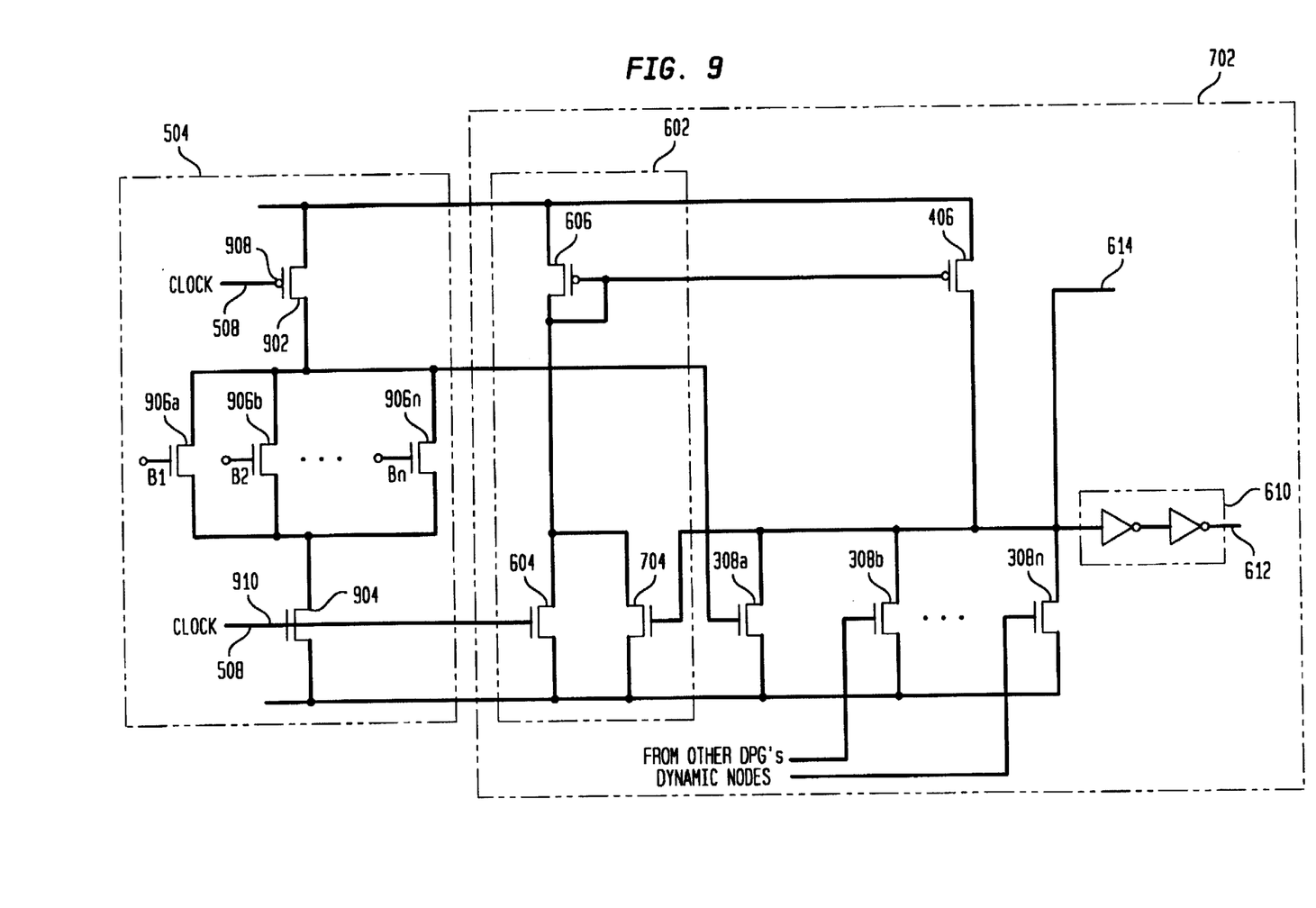
FIG. 9 is a schematic diagram of one embodiment of a DPG NOR gate cascaded with the first embodiment of an improved Pseudo-NMOS NOR gate.

Any embodiment of improved Pseudo-NMOS NOR gates 600, 702, 802 can be cascaded after a DPG NOR gate 504 to form NOR-NOR Domino logic 502 having diminished power consumption and equivalent output rise and fall times. FIG. 9 illustrates one embodiment of Domino logic formed by DPG NOR 504 and IPNNG2 702 gates. The DPG NOR gate 504 evaluates inputs $B_1$–$B_n$ only when the dock signal 508 is high. The DPG NOR gate 504 is comprised of an end PMOS FET, or switch, 902 connected serially with an end NMOS FET, or switch, 904 through a plurality of NMOS FETs 906a–n connected in parallel. The end PMOS FET 902 and NMOS FET 904 have their gates 908, 910 connected to the clock signal 508. The parallel-connected NMOS FETs 906a–n are the switches in the DPG NOR gate 504.

The DPG NOR gate 504 evaluates inputs only when the dock signal 508 is high. When the clock signal 508 is low, the end PMOS FET 902 is turned on and the end NMOS FET 904 is turned off. Thus, the body capacitances, or channel-to-back plane capacitances, of the parallel-connected NMOS FETs 906a–n are charged to about the supply voltage. When the clock signal 508 turns high, the end NMOS FET 904 is turned on so that the parallel connected FETs 906a–n can be switched to their on or off states depending on their inputs $B_1$–$B_n$. Upon the clock signal 508 turning high, the output of the DPG NOR gate 504 is evaluated by the IPNNG2 702 whose switch 604 in the first power control circuit 602 and two PMOS FETs 606, 406 are turned on by the clock signal 508. Thus, the Domino logic 502 provides a evaluated signal at its output 614 sometime after the clock signal 508 turns high.

Figure 10:
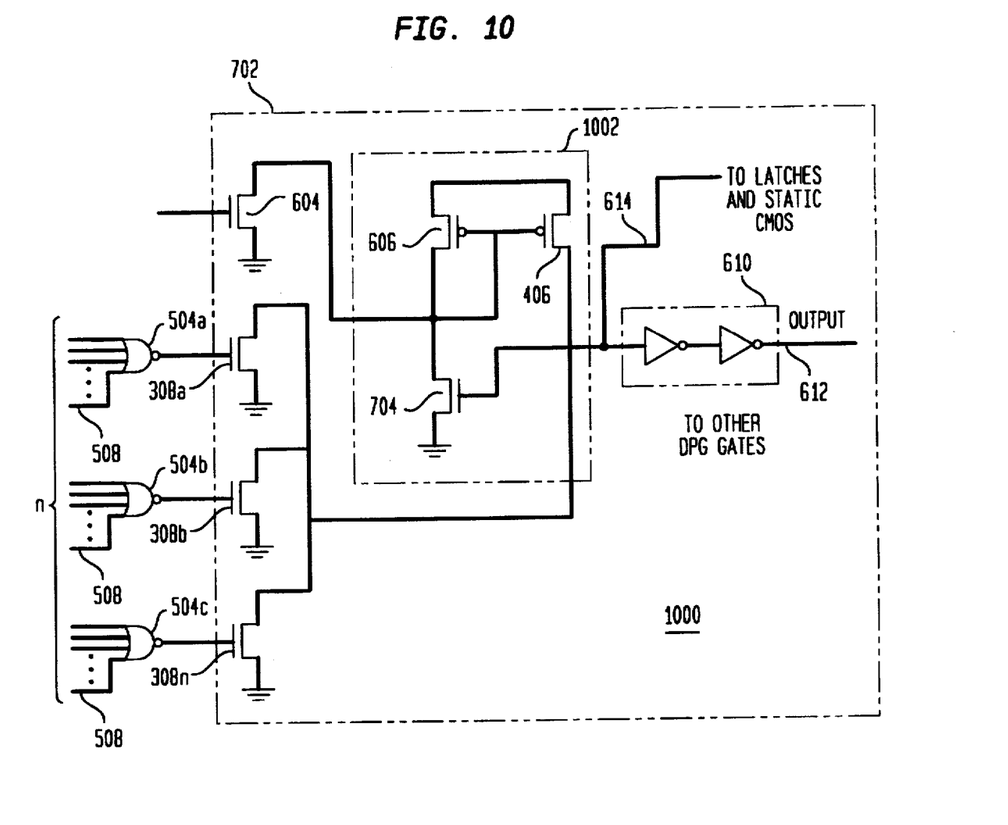
FIG. 10 is a schematic diagram of one embodiment of a DPG NOR-Pseudo-NMOS NOR gate circuit implementing a complex logic function of n sum product terms of m inputs.

FIG. 10 illustrates one embodiment of a DPG NOR-Pseudo-NMOS NOR gate (DNPNNG1) 1000 implementing a complex logic function of n sum product terms of m inputs. FIG. 10 also shows a possible spatial arrangement of the devices. The NMOS switches 308a–n of the IPNNG2 702 are physically located next to each output of the DPG NOR gates 504a–n. This arrangement minimizes the wire routing for the output of the DPG NOR gates 504a–n. Since the outputs of the gates 504a–n are dynamically precharged nodes, these outputs are susceptible to noise and coupling from other signals nearby. To avoid this problem, either the dynamic node can be buffered (e.g. with two CMOS inverters) or the wire lengths can be kept short. Buffering, with the additional inverters, adds undesirable delay. Therefore it is preferable to place the NMOS switches 308a–n proximate to the DPG NOR gates 504a–n to ensure the wire length connecting these components is short.

Figure 11:
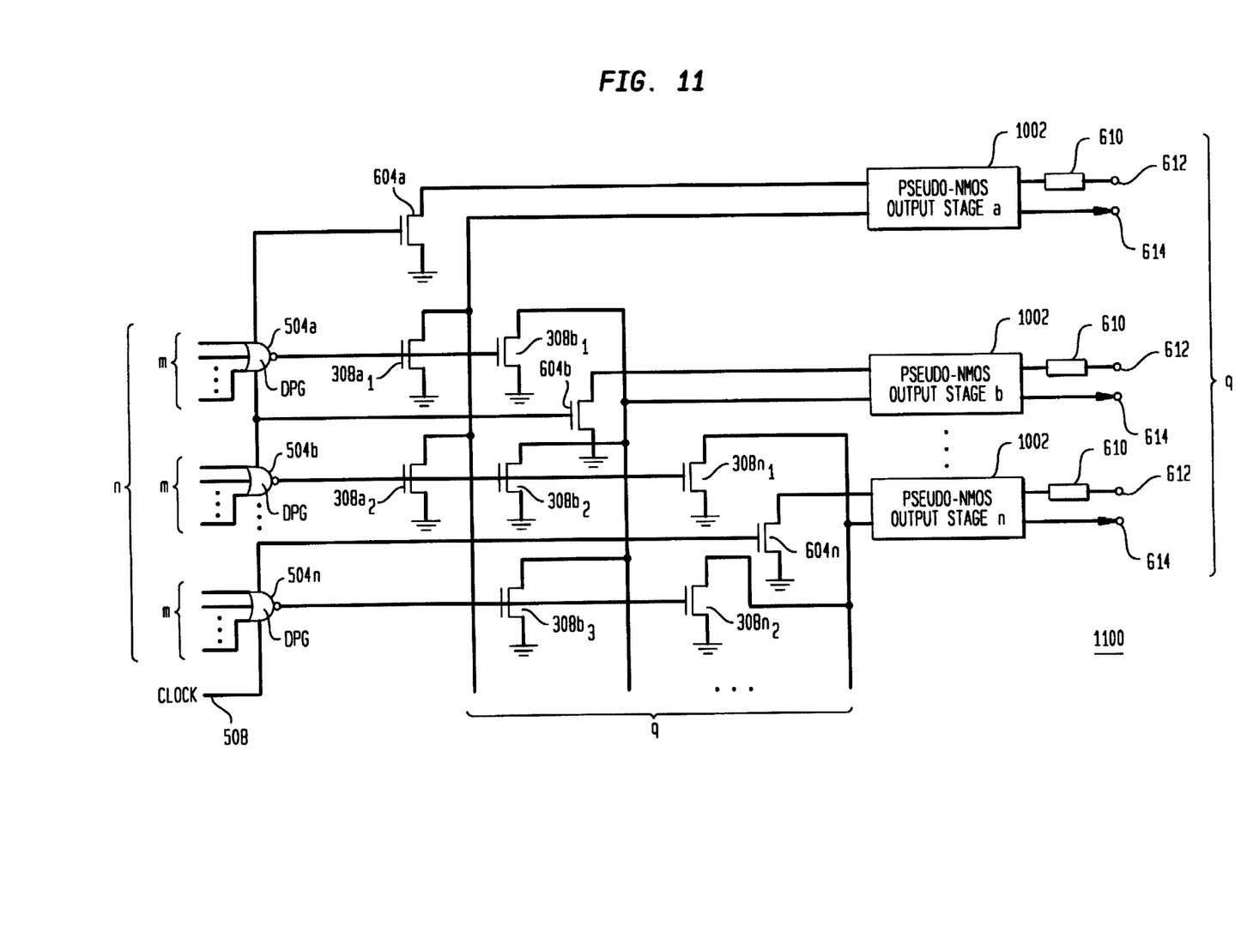
FIG. 11 is a schematic diagram of one embodiment of a DPG NOR-Pseudo-NMOS NOR gate circuit implementing a complex logic function with q outputs of n sum terms of m inputs.

FIG. 11 illustrates one embodiment of a DPG NOR-Pseudo-NMOS NOR gate circuit (DNPNNG2) 1100 implementing a complex logic function with q outputs of n sum terms of m inputs. Each IPNNG2 702 in the DNPNNG1 and DNPNNG2 includes a Pseudo-NMOS output stage 1002 which is a subsection of the IPNNG1 702. The illustrated DNPNNG1 1000 and DNPNNG2 1100 utilize an IPNNG2 702, but could use any form of Pseudo-NMOS NOR gate.

Domino Logic 502 using DPG-Pseudo-NMOS topology can be utilized to implement multi-input logic functions with one 1000 or more 1100 outputs. This topology is suitable for implementation in hardware, such as programmable logic arrays and microprocessors.

Figure 12:
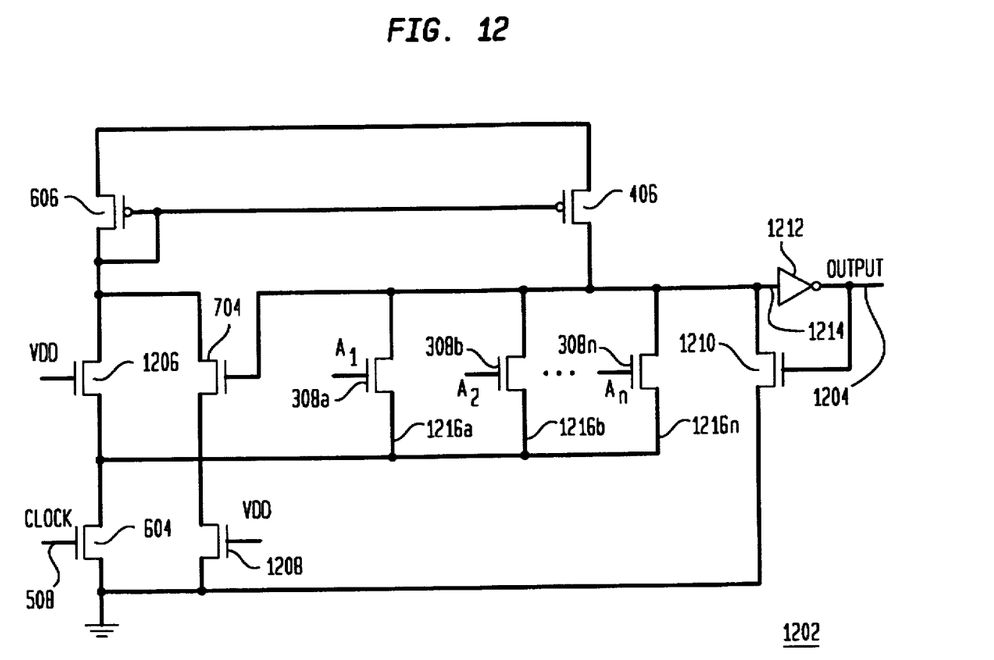
FIG. 12 is a schematic diagram of one embodiment of an n-input OR-LATCH Pseudo-NMOS gate.

A Pseudo-NMOS gate can also be configured to create a latch with large fan-in logic circuit. The inclusion of large fan-in digital logic within a latch improves speed and power consumption in comparison to separately implemented, but coupled, latch and logic circuits. The latch is static, permitting low speed circuit testing. FIG. 12 illustrates one embodiment of a Pseudo-NMOS latch 1202 having large fan-in OR logic. However, a NOR topology may be used in the latch 1202 with the addition of another inverter 1212 at the latch output 1204. Other logic functions can be implemented with Pseudo-NMOS latches.

The OR latch 1202 is essentially comprised of the IPNNG2 702. The OR latch 1202 also includes three additional FETs, or switches, 1206, 1208, 1210 and an inverter 1212. The inverter 1212 in conjunction with a switch 1210 shunted across the input 1214 of the inverter 1212 latches the latch output 1204 when the latch output 1204 is high. The FET 1210 shunted across the input 1214 of the inverter 1212 prevents the voltage at the inverter input 1214 from floating when the output 1204 of the OR latch 1210 is high and the clock signal 508 is low.

The sources 1216a–n of switches 308a–n are connected with the drain 1218 of the switch 604 coupled to the clock signal 508. The latch 1202 includes feedback FET 704 and two FETs, or switches, 1206, 1208 that prevent high voltage signal at inverter input 1214 from floating during a low clock cycle by forcing the inverter input 1214 to be high. The two switches 1206, 1208 are biased on.

Figure 13:
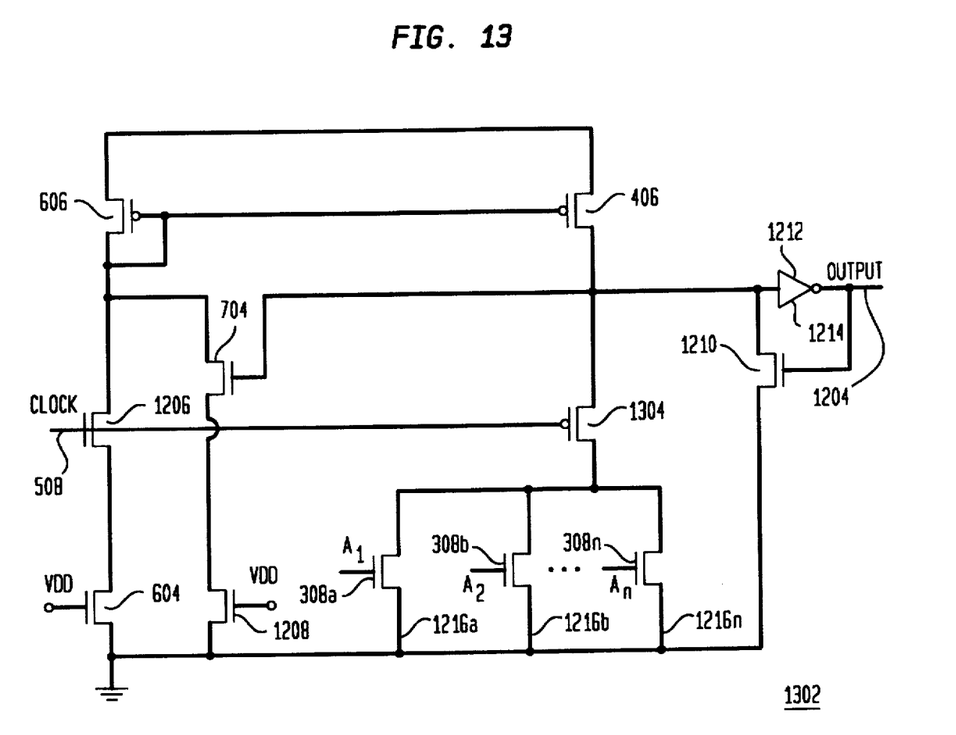
FIG. 13 is a schematic diagram of a preferred embodiment of an n-input OR-LATCH Pseudo-NMOS gate.

FIG. 13 illustrates a preferred embodiment of a Pseudo-NMOS latch 1302. The preferred embodiment of a Pseudo-NMOS latch 1302 in FIG. 13 implements OR logic, however other logic functions could be used. The preferred embodiment of the Pseudo-NMOS latch 1302 is similar to the previously described embodiment of a Pseudo-NMOS latch 1202. However, the preferred embodiment of the Pseudo-NMOS latch 1302 in FIG. 13 includes another FET, or switch, 1304 between the PMOS FET 406 of the current mirror and the switches 308a–n. The gate of this switch 1304 is coupled to the clock signal 508. In addition, the gates of two switches 604, 1206 are now respectively biased on and connected to the clock signal 508.

While various embodiments of the present invention have been described above, it should be understood that they have been presented by way of example only, and not by limitation. Thus, the breadth and scope of the present invention should not be limited by any of the above-described exemplary embodiments, but should be defined only in accordance with the following claims and their equivalents.

What is claimed is:

1. A circuit topology for implementing combinational logic functions comprising:

a dynamically precharged gate; and a Pseudo-NMOS gate coupled to said dynamically precharged gate, comprising
        an active load;
        a switch coupled to said active load; and
        a power control circuitry comprising
            a second active load coupled to said first active load; and
            a second switch coupled to said second active load.

2. The circuit topology of claim 1, wherein said power control circuitry further comprises:

an active device coupled to said first and second switches.

3. The circuit topology of claim 2, wherein said power control circuitry further comprises:

turn-on means for turning on said improved Pseudo-NMOS gate about when the slowest signal appears at the input of the circuit topology.

4. The circuit topology of claim 3, wherein said power management circuit further comprises:

turn-off means for taming off said Pseudo-NMOS gate about when the output of said Pseudo-NMOS gate is low.

* * * * *